(12) United States Patent  (10) Patent No.: US 7,049,668 B1
Hshieh  (45) Date of Patent: May 23, 2006

(54) GATE CONTACTING SCHEME OF A TRENCH MOSFET STRUCTURE

(75) Inventor: Fwu-Iuan Hshieh, Saratoga, CA (US)

(73) Assignee: Alpha and Omega Semiconductor, Ltd., Hamilton (BM)

( * ) Notice: Subject to any disclaimer, the term of this patent is extended or adjusted under 35 U.S.C. 154(b) by 0 days.

(21) Appl. No.: 09/139,935

(22) Filed: Aug. 25, 1998

(51) Int. Cl.
 *H01L 29/76* (2006.01)

(52) U.S. Cl. .................. 257/401; 257/330; 257/331

(58) Field of Classification Search ........ 257/330–334, 257/401; 438/270–274, 259, 589
See application file for complete search history.

(56) References Cited

U.S. PATENT DOCUMENTS

| | | | |
|---|---|---|---|
| 4,791,462 A * | 12/1988 | Blanchard et al. | 357/23.4 |
| 5,034,785 A * | 7/1991 | Blanchard | 357/23.4 |
| 5,298,781 A * | 3/1994 | Cogan et al. | 257/333 |
| 5,614,751 A * | 3/1997 | Yilmaz et al. | 257/394 |
| 5,665,996 A | 9/1997 | Williams et al. | 257/401 |
| 5,682,048 A * | 10/1997 | Shinohara et al. | 257/342 |
| 5,750,416 A * | 5/1998 | Hshieh et al. | 437/40 |
| 5,770,514 A * | 6/1998 | Matsuda et al. | 438/589 |
| 5,894,149 A * | 4/1999 | Uenishi et al. | 257/331 |
| 5,970,344 A * | 10/1999 | Kubo et al. | 438/270 |
| 5,972,741 A * | 10/1999 | Kubo et al. | 438/138 |
| 5,986,304 A * | 11/1999 | Hshieh et al. | 257/330 |

\* cited by examiner

*Primary Examiner*—Ori Nadav
(74) *Attorney, Agent, or Firm*—Bo-In Lin (57) ABSTRACT

A trench MOSFET (Metal Oxide Semiconductor Field Effect Transistor) structure includes crisscrossing trenches formed in a semiconductor substrate. The trenches include inner surfaces filled with conductive material which is electrically separated from the substrate by insulating material. The conductive material is in contact with an overlying first metal layer through a plurality of first contact openings formed in a first insulating layer which is sandwiched between the first metal layer and the trenches. The conductive material in the trenches and the first metal layer constitute the gate of the MOSFET structure. There is also a second metal layer in contact with a source layer formed in the substrate through a plurality of second contact openings formed in a second insulating layer which is sandwiched between the first metal layer and the second metal layer. The second metal layer and the source layer constitute the source of the MOSFET structure. As arranged, the gate and source of the MOSFET structure are connected through separate metal layers on the semiconductor substrate. Consequently, each metal layer maintains higher conductivity and thus faster frequency response. The semiconductor structure formed in accordance with the invention can also assume a higher packing density with lower power-on resistance.

2 Claims, 10 Drawing Sheets

GATE CONTACTING SCHEME OF A TRENCH MOSFET STRUCTURE

BACKGROUND OF THE INVENTION

1. Field of the Invention

The present invention relates generally to microelectronic circuits, and more particularly, to electrical contacting schemes of trench gates in trench MOSFET (Metal Oxide Semiconductor Field Effect Transistor) devices.

2. Description of the Related Art

Power semiconductor devices have been used as power switches for various applications. Advent in semiconductor technologies enables these power devices to operate with high reliability and performance.

Figure 1:
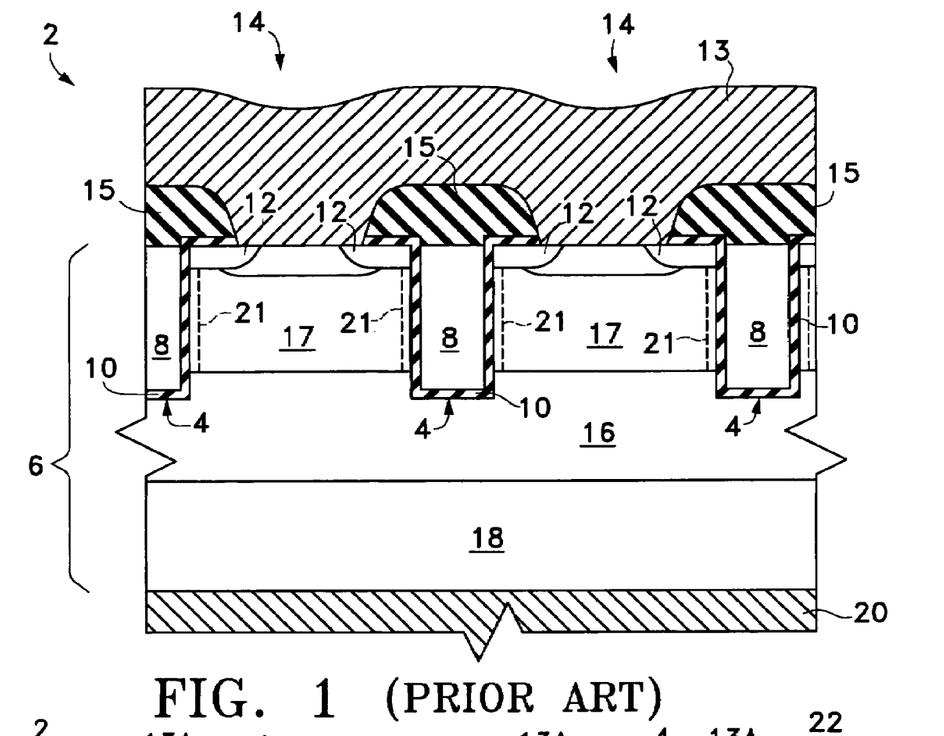
FIG. 1 is a cross-sectional view of a conventional trench MOSFET array having a plurality of trenched cells.

One type of power MOSFET (Metal Oxide Semiconductor Field Effect Transistor) device that shows prominence in application is the trench gate MOSFET power device. In a trench-gate MOSFET device, intersecting trenches which define a plurality of cells are formed in a silicon substrate. FIG. 1 is a cross-sectional view of part of a trench-gate MOSFET device signified by the reference numeral 2. There is a plurality of trenches 4 formed in a substrate 6. The trenches 4 are filled with conductive material 8 separated from the substrate 6 with a thin layer of insulating material 10. There is also a source layer 12 deposited in a body layer 17 which in turn is deposited in the semiconductor substrate 6. The source layer 12 is in contact with a source metal layer 13. An insulating layer 15 separates the conductive material 8 from the source metal layer 13. As arranged, a plurality of MOSFET cells 14 is formed in the substrate 6. Specifically, for each MOSFET cell 14, the source layer 12, the conductive material 8 and insulating material 10 constitute respectively the source, gate and gate oxide layer of a MOSFET. In addition, a lightly doped epitaxial layer 16 coupled with a heavily doped contact layer 18 attached to a drain metal layer 20 forms the common drain of the device 2.

Power MOSFET device with trench gates provide many advantages. To begin with, the channels, signified by the reference numeral 21 in FIG. 1, of the MOSFETs are arranged in a vertical manner, instead of horizontally as in most planar configurations. The consequential benefit is that a higher degree of integration on a semiconductor substrate can be realized. More importantly, since the channel direction is vertical, the lateral current paths are basically eliminated. As a result, the overall channel resistance is reduced. Reduction in channel resistance substantially curtails Ohmic loss during the power-on state of the MOSFET, which in turn provides lower power consumption and further alleviates heat dissipation.

Advantageous as it appears for a trench-gate MOSFET structure, heretofore, there have been technical complications in providing electrical contacts to the conductive material 8 inside the trenches 4.

Figure 2:
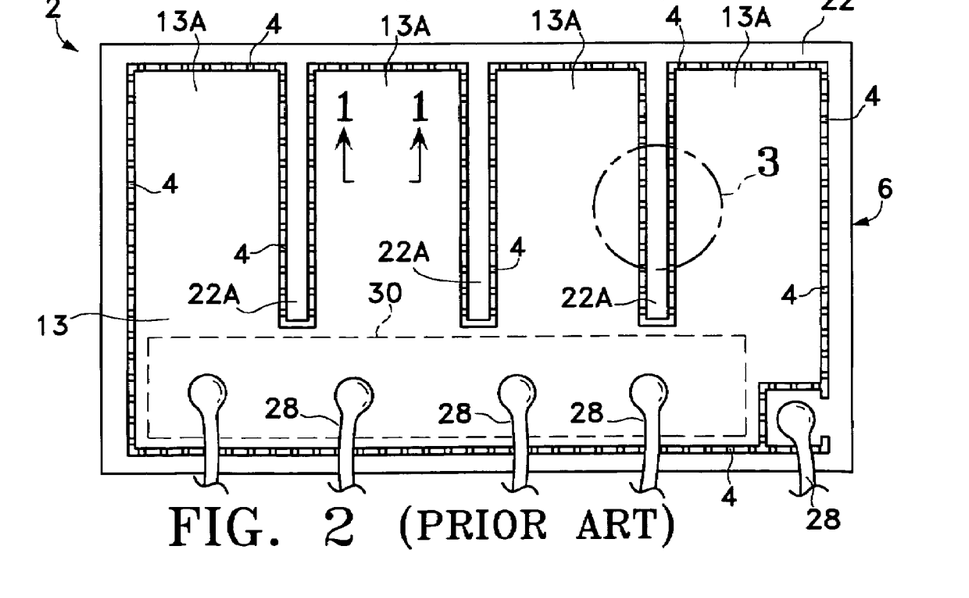
FIG. 2 is a top plan view illustrating the overall metallization scheme the conventional trench MOSFET array as shown in FIG. 1 which is taken along the line 1—1 of FIG. 2.

FIG. 2 is a top plan view of an overall metallization scheme of a conventional power MOSFET structure, such as the structure 2 shown in FIG. 1. FIG. 1, as described above, is a cross-sectional view taken along the line 1—1 of FIG. 2. For clarity and conciseness in illustration, other metal layers such as the metal layers for the terminal circuits are not shown in FIGS. 1 and 2. As can be seen in FIG. 2, the source metal layer 13 is deposited on the semiconductor substrate 6 with a plurality of protruding fingers 13A. In a similar manner, the gate metal 22 is also deposited on the semiconductor substrate 6 with a plurality of protruding fingers 22A. The protruding fingers 13A and 22A electrically separate but interleave with each other on the surface of the substrate 6 as shown in FIG. 2.

Figure 3:
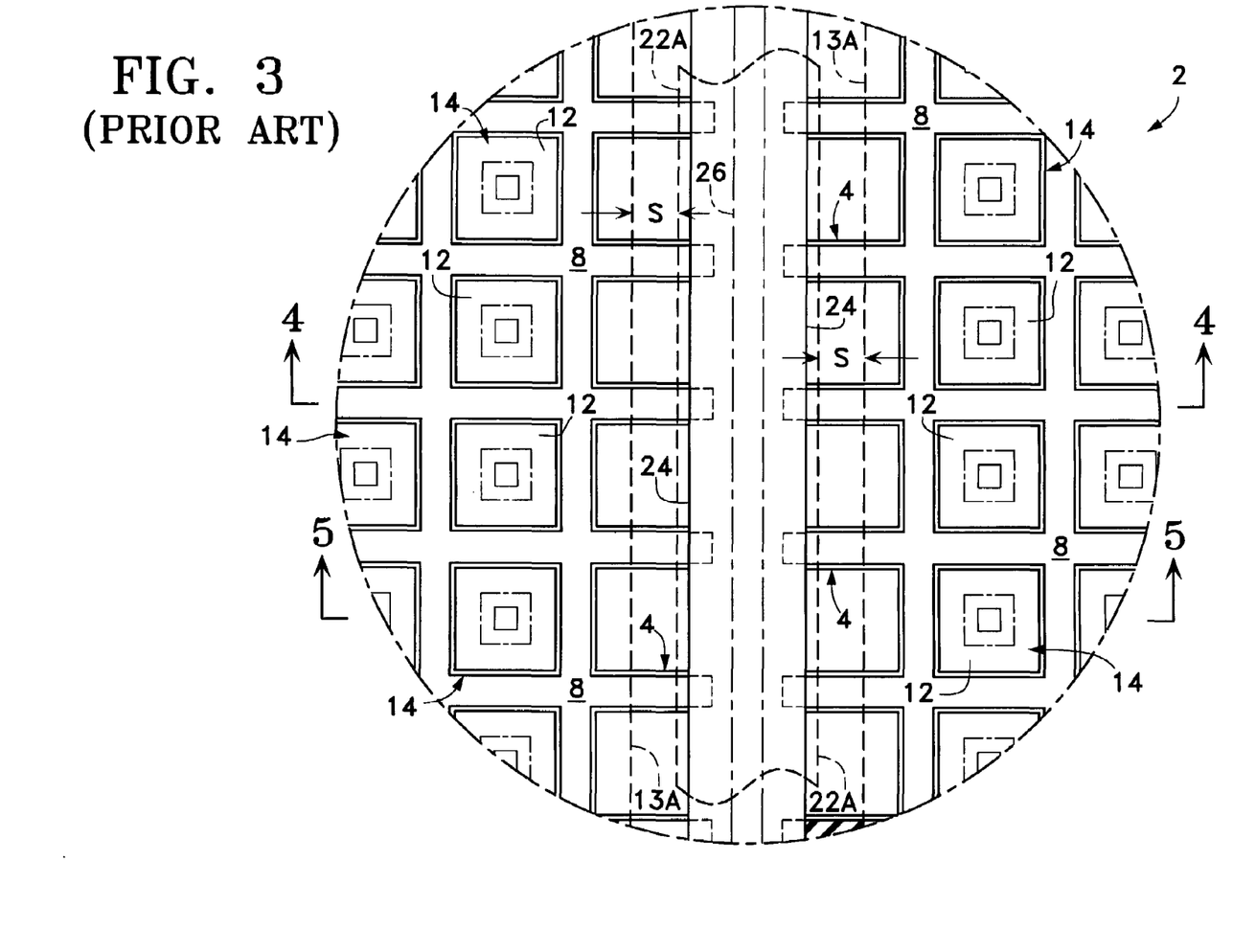
FIG. 3 is an enlarged view taken within the circle 3 of FIG. 2.
Figure 4:
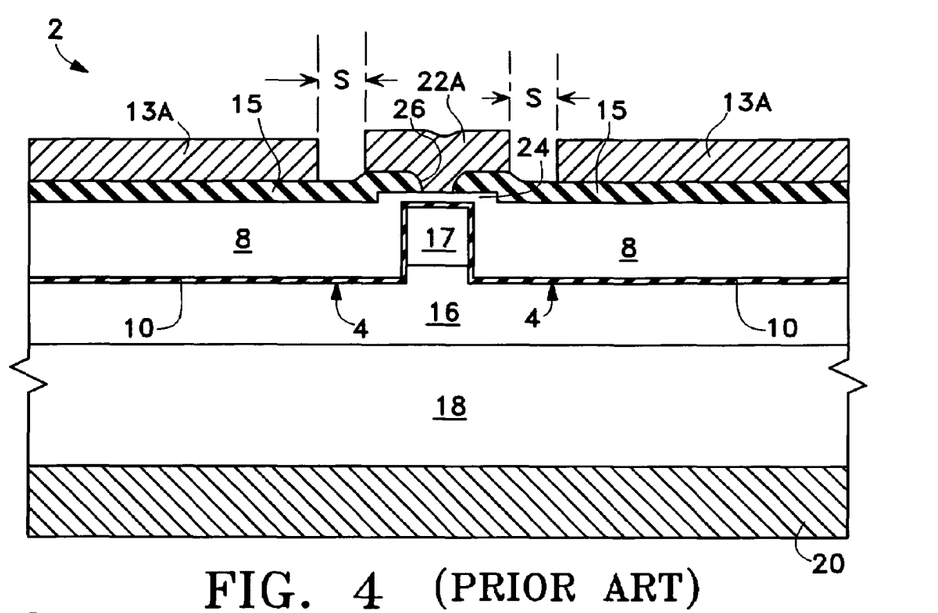
FIG. 4 is a cross-sectional view taken along the line 4—4 of FIG. 3.
Figure 5:
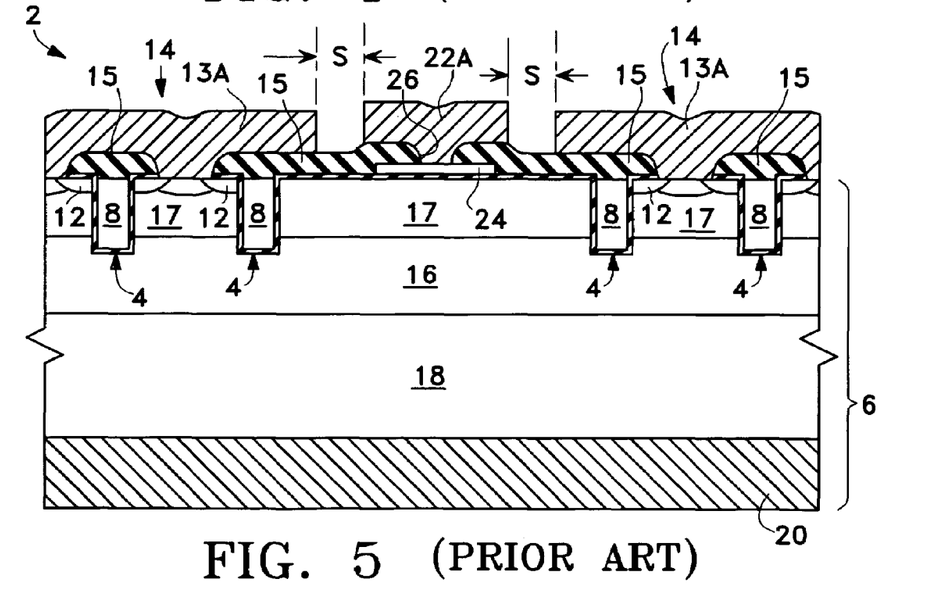
FIG. 5 is a cross-sectional view taken along the line 5—5 of FIG. 3.

FIG. 3 is an enlarged view taken within the circle 3 of FIG. 2. FIGS. 4 and 5 are cross-sectional views taken along the lines 4—4 and 5—5, respectively, of FIG. 3. FIGS. 3–5 highlight the relationship of the source metal layer 13 and the gate metal layer 22 in more details. For clarity in illustration, the metal layers and contact openings are shown in ghost lines in FIG. 3.

As shown in FIGS. 3–5, the source metal finger 13A is disposed in contact with the source layer 12. The gate metal finger 22A is disposed in contact with a poly runner 24 through a contact opening 26. The poly runner 24 is in turn deposited in contact with the conductive material 8 in the trenches 4.

There are several disadvantages associated with the metallization scheme of the conventional structure 2 as shown in FIGS. 1–5. First, the gate metal fingers 22A coupled with the poly runner 24 and the associated contacting trenches 4 use up precious semiconductor spaces on the substrate 6, which spaces could have been used for active cells 14. Furthermore, the conductive material 8 in the trenches 4, even though heavily doped, does not assume conductivity comparable to that of metal. Specifically, the material 8 in the trenches 4 with the relatively high resistivity manifests itself as distributed resistance along the gate-to-source input path, thereby undermining the timing response of the structure 2. Phrased differently, the relatively low conductivity of the material 8 retards the RC (resistance-capacitance) time constant of the gate-to-source input path of the structure 2 and renders the structure 2 not suitable for use in high-frequency applications.

It also should be emphasized that in the design of a power MOSFET, providing a lower power-on resistance $R_{ON}$ is of paramount importance. The power-on resistance $R_{ON}$ of a power MOSFET device is defined as the gross Ohmic resistance through the device during the power-on state. Lower power-on resistance $R_{ON}$ not only curtails power consumption and thus cuts down wasteful heat dissipation, it also prevents the power MOSFET device from robbing away any intended driving voltage to the circuits that the MOSFET device drives. That is, lower Ohmic drop passing through the power MOSFET device during normal operation avails the target circuit driven by the MOSFET device with a less distorted driving voltage. Modern-day MOSFET power devices can now be made with power-on resistance $R_{ON}$ in the milliohm (mΩ) range. The segmented source metal 13 unnecessarily adds source metal resistance to the overall power-on resistance $R_{ON}$ of the structure 2.

The fabrication of the conventional structure 2 also requires a relatively tight manufacturing control. For example, the metal-to-metal separation between the source metal layer 13 and the gate metal layer 22, identified in FIGS. 3–5 as separation S, needs to be tightly controlled. Thus, if the separation S falls beyond a certain manufacturing tolerance, there is a risk of electrical shorts between the metal layers 13 and 22 and is detrimental to the production yield. To maintain the tolerance, constant monitoring is required during processing.

It also needs to be mentioned that the structure 2 does not have a relatively wide degree of flexibility during die-bonding. Reference is now directed to FIG. 2. During the die-bonding process, the electrical terminals of the structure 2, such as the source metal 13, need to be connected to a chip carrier (not shown) via the bond wires 28. As shown in FIG. 2, the bond wires 28 for the source metal layer 13 is confined to an area designated by the reference numeral 30 which is away from the gate metal fingers 22A on the substrate 6. Any misstepping of the bond wire 28 beyond the confined area 30 may result in electrical shorts between the metal fingers 13A and 22A.

Electronic products are now built with ever increasing complexity providing various functions which require high-frequency operations and critically depend on the reliable supply of power by the power devices. There has been a long-felt demand to provide dependable, responsive and robust power devices to these modern-day products without the aforementioned shortfalls.

SUMMARY OF THE INVENTION

It is accordingly the object of the invention to provide a MOSFET structure with a low gate resistance thereby allowing the structure to be suitable for high-frequency applications.

It is another object of the invention to provide a MOSFET structure with a low power-on resistance.

It is yet another object of the invention to provide a MOSFET structure with high packing density.

It is still another object of the invention to provide a MOSFET structure with less stringent manufacturing tolerance control in the metal deposition process and further with flexibility in the wire-bonding process.

The MOSFET structure in accordance with the invention accomplishes the above objectives via a novel metal routing scheme. In a preferred embodiment, the MOSFET structure of the invention includes crisscrossing trenches formed in a semiconductor substrate. The trenches include inner surfaces filled with conductive material which in turn is electrically separated from the substrate by insulating material. The conductive material is in contact with an overlying first metal layer through a plurality of first contact openings formed in a first insulating layer which is sandwiched between the first metal layer and the trenches. The conductive material in the trenches and the first metal layer constitute the gate of the MOSFET structure. There is also a second metal layer in contact with a source layer formed in the substrate through a plurality of second contact openings formed in a second insulating layer which is sandwiched between the first metal layer and the second metal layer. The second metal layer and the source layer constitute the source of the MOSFET structure. In the MOSFET structure of the invention, the gate and source are connected through separate metal layers. As arranged, the gate and source of the MOSFET structure are connected through separate metal layers on the semiconductor substrate. Consequently, each metal layer maintains a higher conductivity and thus faster frequency response. The semiconductor structure formed in accordance with the invention can also assume a higher packing density with lower power-on resistance.

These and other features and advantages of the invention will be apparent to those skilled in the art from the following detailed description, taken together with the accompanying drawings, in which like reference numerals refer to like parts.

DETAILED DESCRIPTION OF THE INVENTION

Reference is now made to FIGS. 6–9 which show the first embodiment of the invention. The semiconductor structure of this embodiment is generally signified by the reference numeral 40. FIG. 5 is a top plan view of the structure 40 illustrated as packaged on a chip carrier 42. The relationship between the structure 40 and the chip carrier 42 in association with the bonding wires 86 will be explained later in this specification. The structure 40 includes a plurality of semiconductor cells 44 in which some of the cells 44 are shown in hidden lines in FIG. 6.

Figure 6:
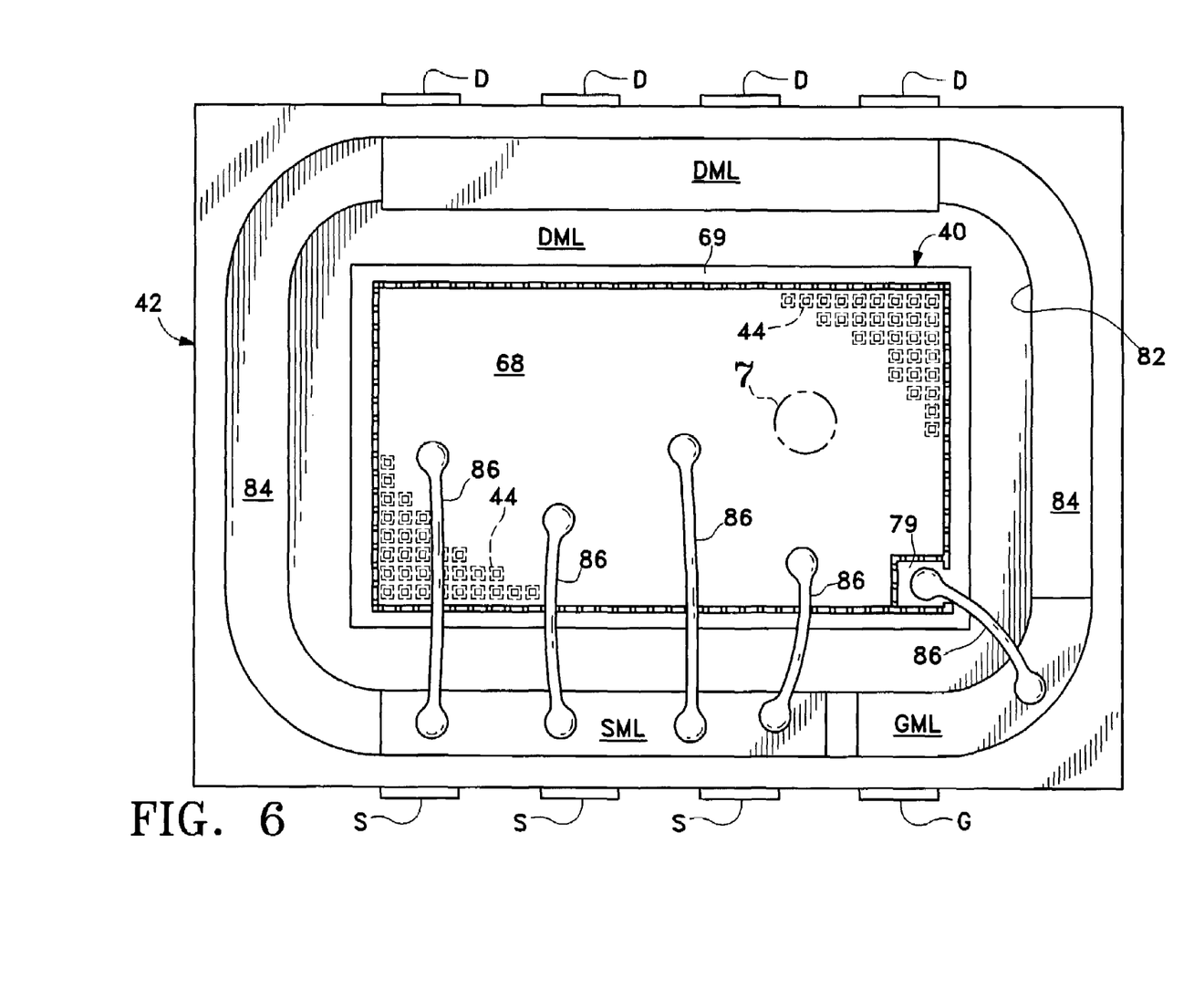
FIG. 6 is a top plan view illustrating the overall metallization scheme of the first embodiment of the invention.
Figure 7:
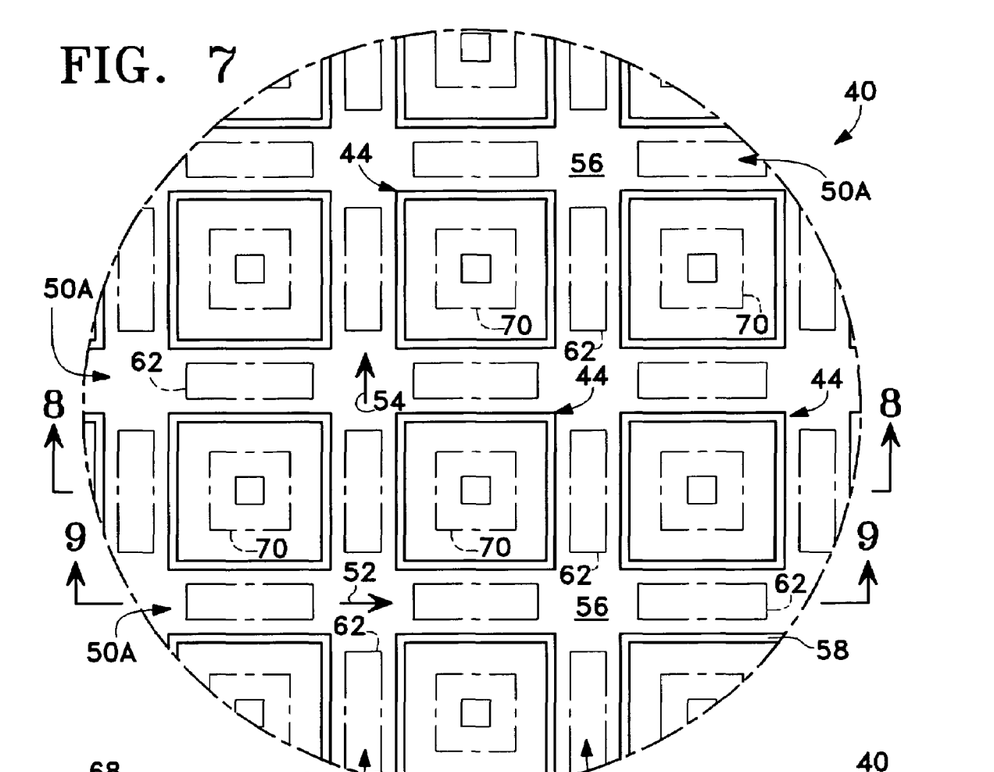
FIG. 7 is an enlarged view taken within the circle 7 of FIG. 6.

FIG. 7 is an enlarged view taken within the circle 7 of FIG. 6. For purpose of illustration, the overlying metal layers in FIG. 7 are removed. In additional, the contact openings are shown in ghost lines. However, the metal layers and the contact openings are clearly shown in FIGS. 8 and 9 which are cross-sectional side views taken along the lines 8—8 and 9—9, respectively, of FIG. 6.

Reference is now directed to FIGS. 6–9. The semiconductor structure 40 is formed on a semiconductor substrate 46 having a major surface 48. There is a plurality of intersecting trenches 50A and 50B formed in the substrate 46. Some trenches 50A are oriented in a first direction, such as the horizontal direction 52 as shown in FIG. 7. Likewise, other trenches 50B are oriented in a second direction, such as the vertical direction 54 as also shown in FIG. 7. The trenches 50A and 50B are filled with conductive material 56 which is electrically separated from the substrate 46 with a thin layer of insulating material 58. The materials used for the conductive material 48 and the insulating material 50 can respectively be polycrystalline silicon (Si) and silicon dioxide (SiO$_2$), for example. Disposed atop the trenches 50A and 50B is a first insulating layer 60 which is patterned with a plurality of contact openings, called the first contact openings 62 formed in the layer 60. Above the first insulating layer 60 is a first conductive layer 64 which is disposed in contact with the conductive material 56 in the trenches 50A and 50B through the first contact openings 62.

Figure 8:
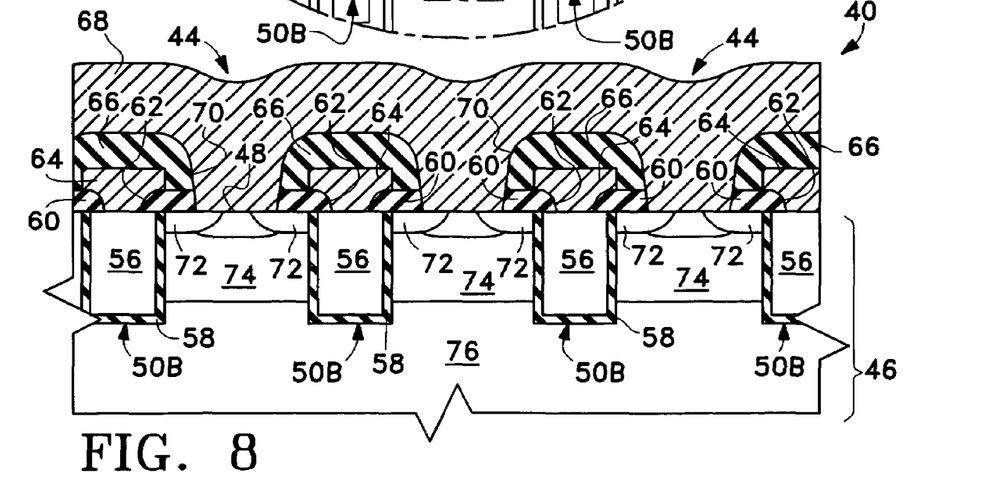
FIG. 8 is a cross-sectional view taken along the line 8—8 of FIG. 7.
Figure 9:
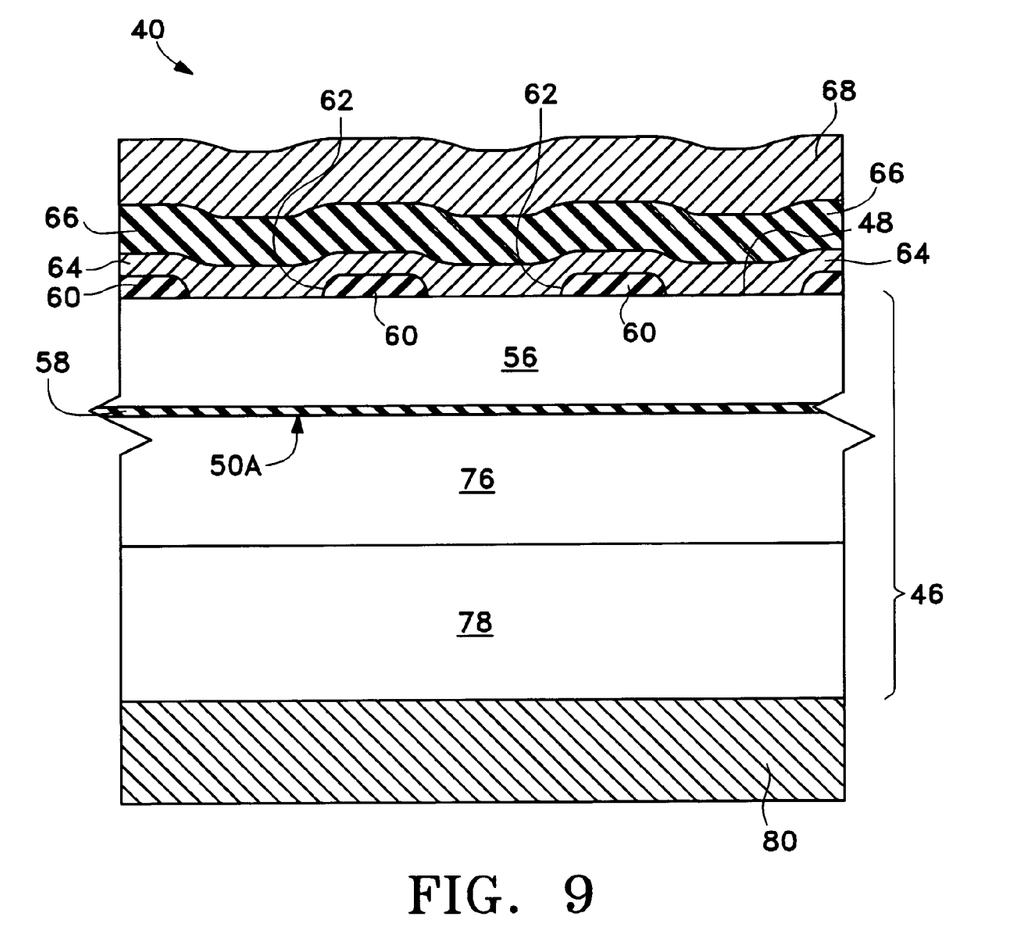
FIG. 9 is a cross-sectional view taken along the line 9—9 of FIG. 7.

The first metal layer 64 in this embodiment is formed of crisscrossing segments running in the directions 52 and 54 and is disposed in alignment with the trenches 50A and 50B. For example, the segments of the first metal layer 64 shown in FIG. 8 are running in the second direction 54.

Over the first conductive layer 64 is a second insulating layer 66. A second conductive layer 68 is deposited above the second insulating layer 66. The second conductive layer 68 is disposed in contact with the semiconductor substrate 46 through another plurality of contact openings, called the second contact openings 70.

In this embodiment, the first and second conductive layers 64 and 68 are made of aluminum (Al). The first and second insulating layers 60 and 66 are made of undoped silicon dioxide (SiO$_2$). However, other materials can be used as substitutes. For instance, material for the first and second conductive layers 64 and 68 can be copper (Cu), aluminum silicide (AlSi), or alloy of aluminum, silicon and copper (AlSiCu). The material for the first and second insulating layers 60 and 62 can be PSG (phosphorous silicon glass) BPGS (borophosphorous silicon glass), for example.

The intersecting trenches 50A and 50B define the plurality of MOSFET cells 44. Each MOSFET cell 44 includes a source layer 72 which in turn is deposited in a lightly doped body layer 74 (FIG. 8). The source layer 72 is disposed in contact with the second conductive layer 68 which is the source metal layer in this case. For each MOSFET cell 44, the source layer 72, the conductive material 56 and insulating material 58 constitute respectively the source, gate and gate oxide layer of a MOSFET cell. The body layer 74 is deposited in an epitaxially grown layer 76. The lightly doped epitaxial layer 76 coupled with a heavily doped contact layer 78 (FIG. 9) attached to a drain metal layer 80 (FIG. 9) form the common drain of the structure 40.

The MOSFET 40 in accordance with the invention can provide substantially improved performance both in the high-frequency and steady-state operations over most prior art counterparts, such as the structure 2 shown in FIGS. 1–5. First, without the interleaving gate metal fingers, such as the gate metal fingers 22A coupled with the poly runner 24 as in the structure 2 shown in FIGS. 2–5, all spaces are almost fully utilized for the active cells 44 placement. That is, the architectural layout of the inventive structure 40 is different form most prior art structures, such as the structure 2 shown in FIGS. 1–5, in which a substantial portion of the semiconductor space is dedicated for non-active cells. The structure 40 of the invention can thus achieve a high packing density.

The first conductive layer 64 above the trenches 50A and 50B is highly conductive. As a consequence, the resistance component of the RC time constant, which determines the time response of the gate-to-source input path as described above, is significantly reduced. This feature facilitates the turn-on and turn-off of the structure 40, thereby enabling the structure 40 to function responsively in high-frequency applications.

The second metal layer 68, the source metal layer in this case, is a substantially continuous layer and thus can maintain a high conductivity. The consequence benefit is that the continuous layer 68 contributes a lower power-on resistance $R_{ON}$ of the structure 40. As mentioned before, modern-day power devices can achieve a power-on resistance $R_{ON}$ in the milliohm (mΩ) range. The continuous second metal layer 68 makes a significant difference in maintaining a low power-on resistance $R_{ON}$ within the sub-milliohm range.

With no interleaving metal fingers, such as the fingers 13A and 22A of the structure 2 shown in FIGS. 2–4, side-by-side electrical shorts between the first metal layer 64 and the second metal layer 68 are less of a concern because the two layers 64 and 68 are separated by the thick second insulating layer 66. Thus, the structure 40 can be fabricated with no side-by-side metal separation rule in the active cell areas.

There is also more bonding flexibility for the structure 40 during the die-bonding process. Reference is now returned to FIG. 6. The structure 40 is shown as disposed in the chip carrier 42 which is part of an eight-pin dual-in-line package in this example. The carrier 42 has a cavity 82 with a cavity bottom which is lined with a drain metal lead DML. During chip packaging, the drain metal layer 80 (FIG. 9) is directly soldered onto the drain metal lead DML, for example. The drain metal lead DML is electrically tied to the drain terminal pins D affixed externally on the carrier 42. The cavity 82 has a ledge portion 84 onto which the gate metal lead GML and the source metal leads SML are attached. Bond wires 86 are bonded between the leads GML and SML and the relevant metal layers of the structure 40. For example, the source metal lead SML is bonded to the second metal layer 68 through the bond wires 86. Similarly, the gate metal lead GML is bonded to a gate metal layer 69 through the bond wire 86. As can be seen in FIG. 6, there is more flexibility in placing the wires 86 on the second conductive layer 68 because it is continuous and thus provides a larger bondable area. That is, there is no need to restrict the bonding to a confined area, such as the area 30 for the structure 2 as shown in FIG. 2.

Figure 10:
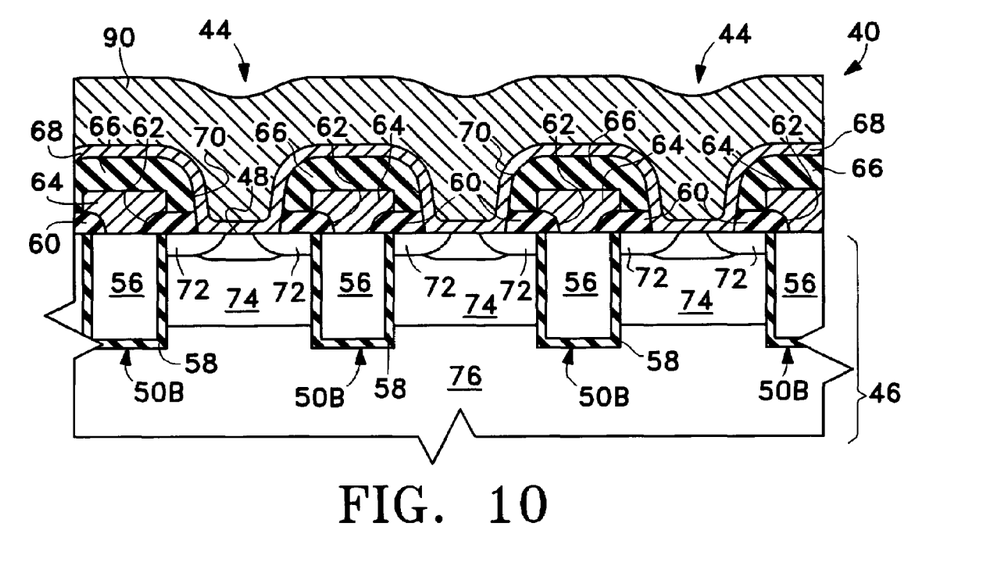
FIG. 10 is a cross-sectional view of another variation of the metallization scheme in accordance with the invention in which the source metal layer is plated with another metal layer.

To further achieve a lower power-on resistance $R_{ON}$, the second conductive layer 68 can be plated with a highly conductive metal layer 90. FIG. 10 shows such an arrangement in which a highly conductive metal such as copper (Cu) is electroplated onto the relatively thinly deposited second conductive layer 68 which is made of aluminum (Al). Aluminum has a better adhesiveness with silicon and silicon dioxide and thus the second conductive layer 68 which is made of aluminum is interposed between the plated layer 90 and the substrate 46.

Figure 11:
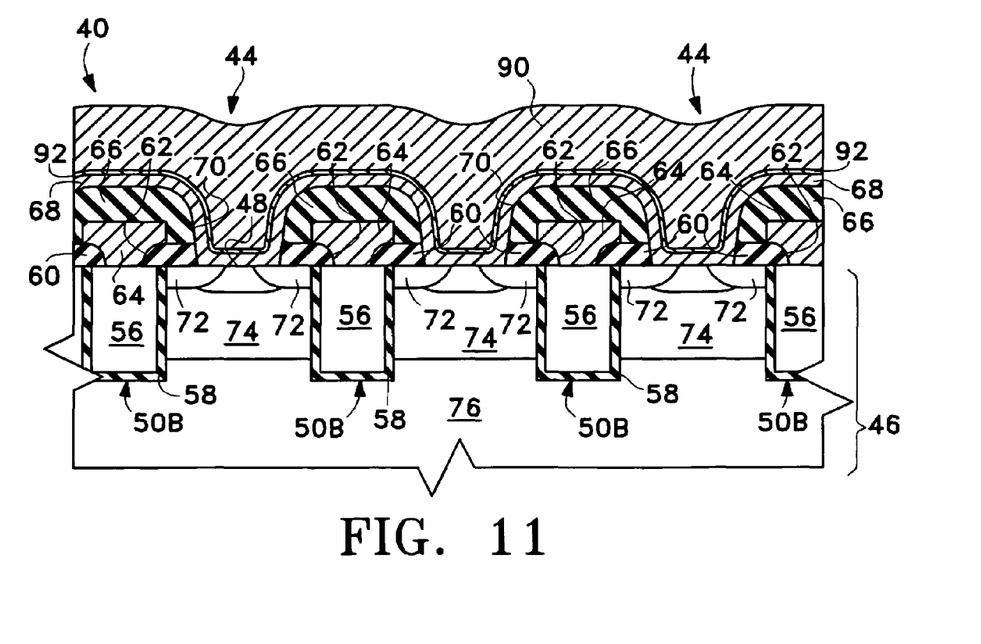
FIG. 11 is a cross-sectional view of yet another variation of the metallization scheme in accordance with the invention in which the source metal layer is plated with another metal layer interposed with a primer layer.

If the plated layer 90 is made of material which has a lesser affinity with aluminum, a primer layer 92 can be sandwiched between the plated layer 90 and the second conductive layer 68 as shown in FIG. 11. For instance, the plated layer 90 and the primer layer can be made respectively of nickel (Ni) and tin (Sn), in which tin is "wettable" to both nickel and aluminum in the eutectic states.

Figure 12:
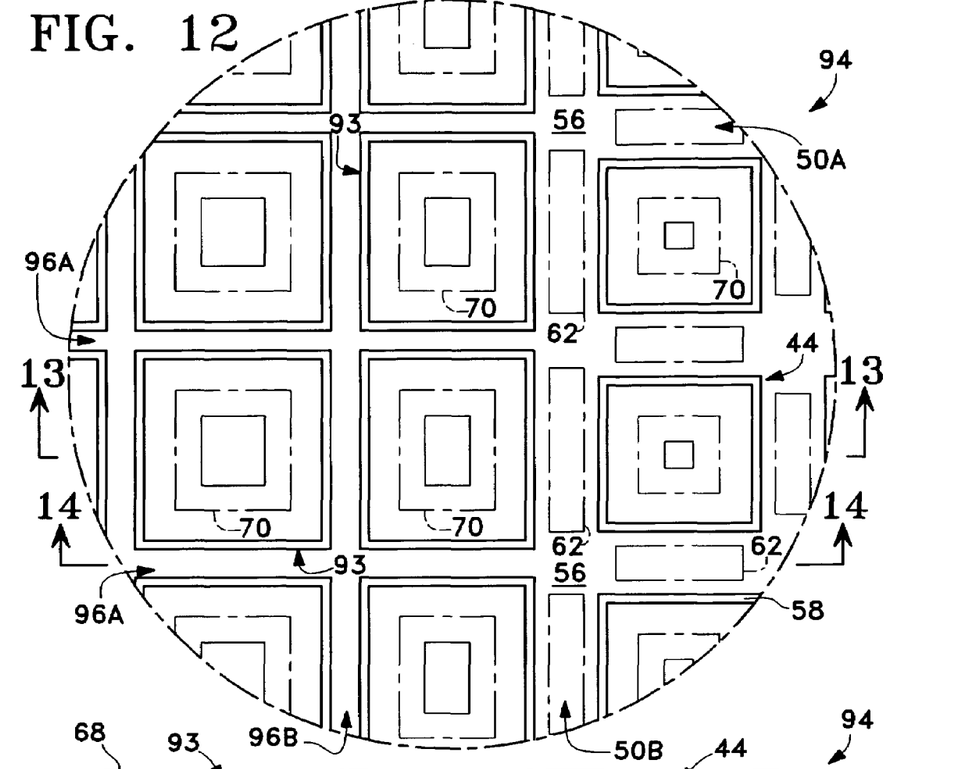
FIG. 12 is a top plan view of a second embodiment of the invention comprising low-resistance and low-capacitance cells interleaving with each other formed in the silicon substrate.
Figure 13:
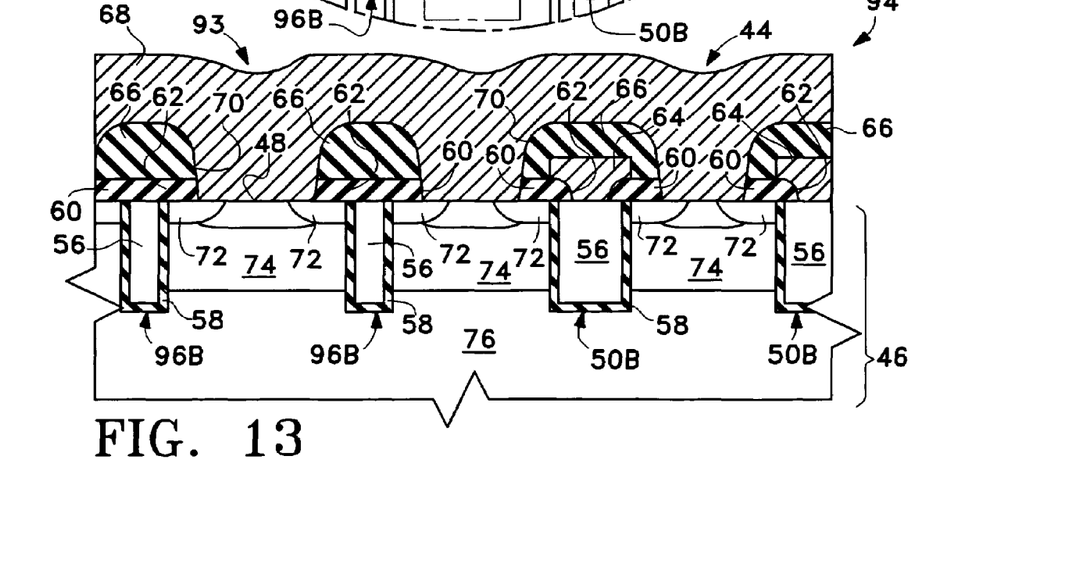
FIG. 13 is a cross-sectional view taken along the line 13—13 of FIG. 12.
Figure 14:
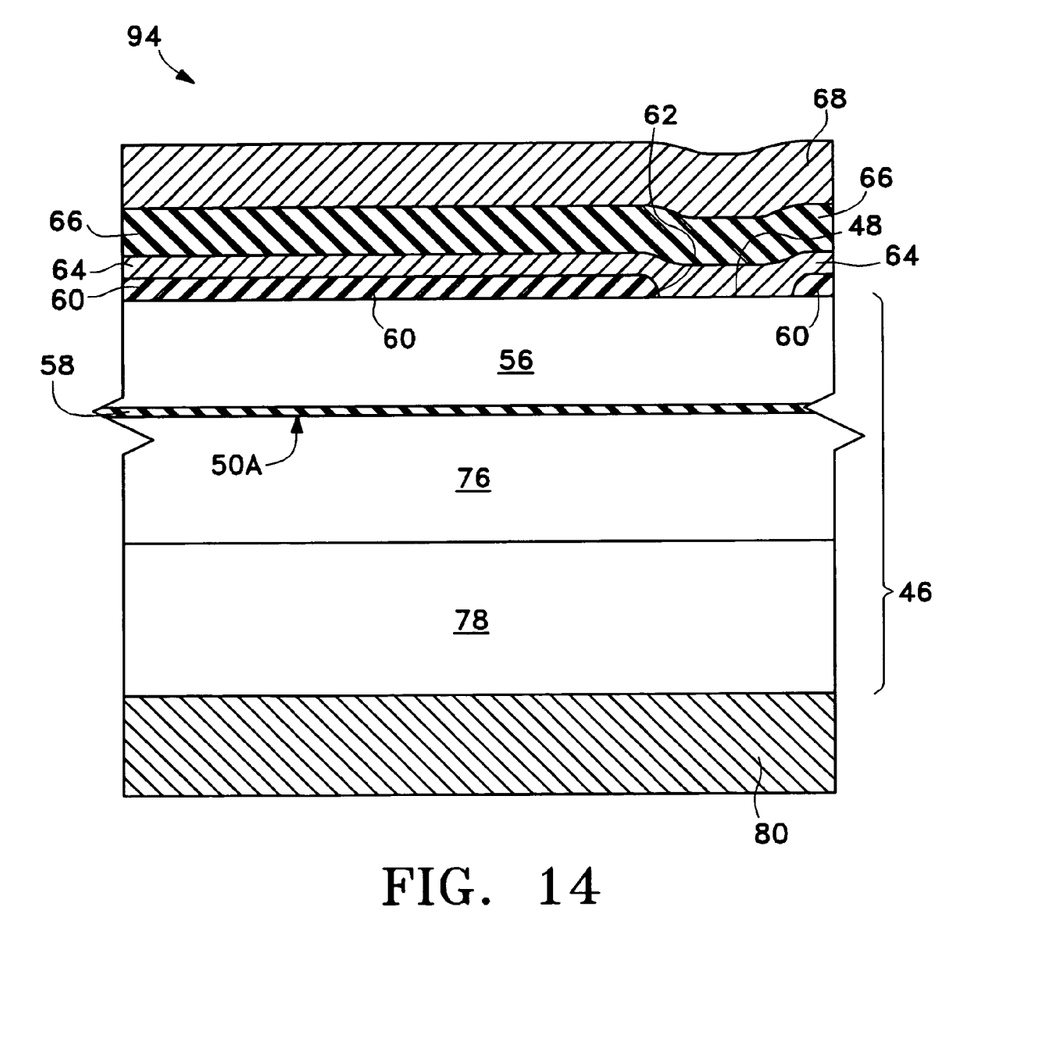
FIG. 14 is a cross-sectional view taken along the line 14—14 of FIG. 12.

FIGS. 12–14 show a second embodiment of the invention generally signified by the reference numeral 94. FIG. 12 is a top plan view of the structure 94. FIGS. 13 and 14 are cross-sectional views taken along the lines 13—13 and 14—14, respectively, of FIG. 12. The structural arrangement of this embodiment is substantially the same as the previous embodiment with the exception that there are two types of cells, namely, the low-resistance cells 44 and the low-capacitance cells 93 formed in the substrate 46. The low-resistance cells 44 are more or less similar to the cells 44 as described in the previous embodiment and is therefore not repeated in here. However, to facilitate description, the trenches 50A and 50B are now called low-resistance trenches which are wider than the corresponding trenches 96A and 96B of the low-capacitance cells 93. Furthermore, the low-resistance trenches 50A and 50B are disposed in contact with the first conductive layer 64 as described previously. The characteristics of the low-capacitance cells 93 are herein described.

Each low-capacitance cell 93 includes a low-capacitance trench 96A or 96B which is narrower in width than the corresponding low-resistance trench 50A or 50B in each low-resistance cell 44. Thus the interior surface area, the area encompassing the conductive material 56, of each low-capacitance trench 96A or 96B is substantially reduced, resulting in lower parasitic capacitance associated with each trench 96A or 96B. Because of the narrower trench width, it may be difficult to form a contact opening, such as the first opening 66 above each low-resistance trench 50A or 50B, as shown in FIG. 3. Thus, the contact opening associated with the first metal layer above the low-capacitance trenches 96A and 96B are dispensed with. As a result, each low-capacitance cell 93 may carry a higher gate resistance $R_G$. However, the smaller trench interior surface area renders each trench 96A or 96B with much lower gate-to-drain $C_{GD}$ capacitance.

To optimize the RC time constant of the structure 94 in high-frequency operations, the structure 94 can be laid out with certain number of rows of low-capacitance cells 93 interleaved with another certain number of rows of low-resistance cells 44 in the substrate 46, as shown in FIGS. 12–14. Likewise, a certain number of columns of low-capacitance cells 93 can be interleaved with another number of columns of low-resistance cells 44 in the substrate 46, as shown in FIGS. 12–14. As a further alternative, a combination of the above arrangements can also be formed in the substrate 46.

As with the previous embodiment, to further reduce the power-on resistance $R_{ON}$, the second conductive layer 68 can be plated with another highly conductive layer, in the similar manner as the layer 90 plated onto the layer 68 shown in FIGS. 10 and 11. For clarity and conciseness in description, the plating of the second conductive layer 68 is not further elaborated in here.

Figure 15:
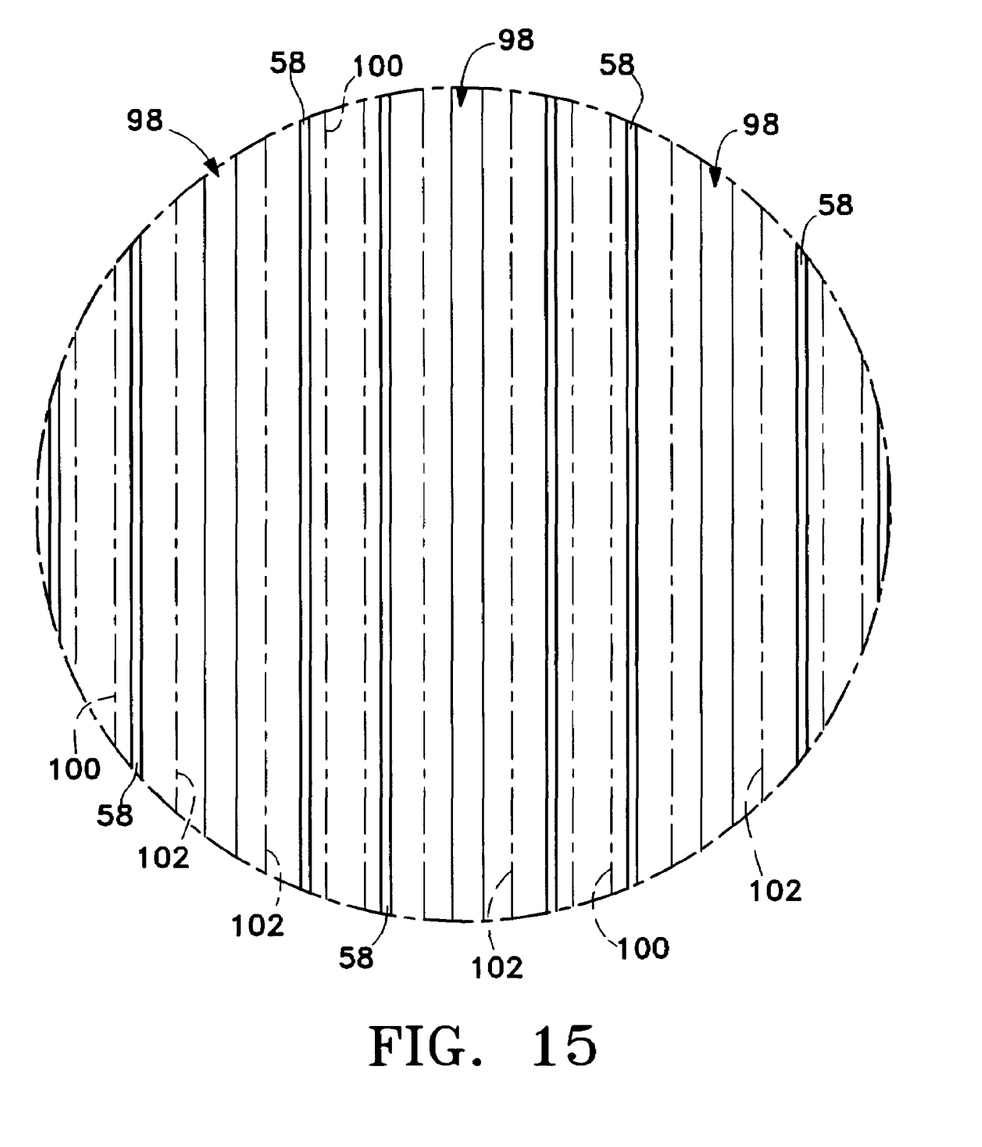
FIG. 15 is another arrangement in accordance with the invention in which the cells are fabricated as elongated in shape.

Finally, other changes are possible within the scope of the invention. The embodiments as described include rectangular or square cells 44 and 93. The cells can well assume other configurations or shapes such as triangular, hexagonal, or octagonal, to name just a few. By way of illustration, the cells can be elongated in shape. FIG. 15 shows such an arrangement in which the cells 98 are fabricated in the form of strips with corresponding elongated first and second openings 100 and 102. In addition, the gate metal ring layer 69 can be dispensed with, with only the gate metal pad 79 (FIG. 6) exposed for bonding. That is, the gate metal pad 79 can be directly electrically tied to the first metal layer 64, instead of passing through the gate metal ring layer 68 as intermediary. This arrangement can completely eliminate the need to monitor the side-by-side metal separation in the actual cell area. Furthermore, in the first embodiment, there is a plurality of first contact openings 62. The purpose is to secure a firm contact surface on the conductive material 56. The areas above the conductive material 56 which the trenches 50A and 50B intersect may include concave dimples which may provide inferior contacts. As such, the contact openings 62 are preferably formed beyond the dimples. However, in sufficiently narrow trenches, such concave dimples may not exist. Should that be the case, the first contact openings 62 can be one continuous opening, instead of segmented as shown in FIG. 7. The device fabricated in accordance with the invention need not be a power MOSFET as described. It can well be slightly modified and used for other types of device, such as a dynamic random access memory (DRAM) cell, an insulated gate bipolar transistor (IGBT), or a charge-coupled-device (CCD), to name just a few. It will be understood by those skilled in the art that these and other changes in form and detail may be made therein without departing from the scope and spirit of the invention.

What is claimed is:

1. A semiconductor structure comprising:
   a substrate having a major surface;
   a plurality of low-resistance trenches formed in said substrate extending from said major surface, some of said low-resistance trenches being orientated in a first direction and others of said low-resistance trenches being orientated in a second direction, each of said low-resistance trenches being filled with conductive material which is electrically separated from said substrate by insulating material, said conductive material comprises polycrystalline silicon;
   a first insulating layer disposed on said major surface above said low-resistance trenches, said first insulating layer having a plurality of first contact openings above said low-resistance trenches along said first and second directions, said first insulating layer comprises silicon dioxide;
   a first conductive layer having crisscrossing segments disposed above said major surface of said substrate, some of said segments being orientated in said first direction and others of said segments being orientated in said second direction, each of said segments being disposed in substantial alignment and in contact with one of said low-resistance trenches through one of said first openings;
   a plurality of low-capacitance trenches disposed in said substrate, each of said low-capacitance trenches being disposed without said first conductive layer disposed thereabove and having a trench width substantially narrower than the corresponding trench width of each of said low-resistance trenches, said low-resistance trenches and said low-capacitance trenches being disposed interposing with each other in said substrates;
   a second insulating layer disclosed above said first conductive layer, said second insulating layer having a plurality of second contact openings, said second insulating layer comprises borophosphorous silicon glass;
   a second conductive layer disposed above said second insulating layer and in contact with said substrate through said second contact openings, said second conductive layer being substantially rectangular in shape disposed on said major surface of said substrate, wherein said rectangular shape of said second conductive layer having no elongated voids extended therein, thereby allowing bonding wires to be substantially unrestrictively attached onto said second conductive layer, said second conductive layer is plated with copper; and
   a source layer disposed in said substrate extending from said major surface, wherein said structure is a MOSFET structure having a source, a drain and a gate, said source includes said source layer, said drain includes said substrate, and said gate includes said low-resistance and low-capacitance trenches.

2. A semiconductor structure comprising:
   a substrate having a major surface;
   a plurality of low-resistance trenches disposed in said substrate extending from said major surface, some of said low-resistance trenches being orientated in a first direction and others of said low-resistance trenches being orientated in a second direction, each of said low-resistance trenches being filled with conductive material which is electrically separated from said substrate by insulating material;
an insulating layer disposed on said major surface above said trenches, said insulating layer having a plurality of contact openings positioned above said trenches along said first and second directions;
a conductive layer disposed above said insulating layer and in contact with said conductive material in said trenches through said contact openings; and
a plurality of low-capacitance trenches disposed in said substrate, each of said low-capacitance trenches being formed without said conductive layer disposed thereabove and having a trench width substantially narrower than the corresponding trench width of each of said low-resistance trenches, said low-resistance trenches and said low-capacitance trenches being disposed interleaving with each other in said substrate.

* * * * *